(12) United States Patent
Kondo (10) Patent No.: US 9,142,689 B2
(45) Date of Patent: Sep. 22, 2015

(54) SOLID-STATE IMAGING APPARATUS AND IMAGING APPARATUS

(71) Applicant: OLYMPUS CORPORATION, Tokyo (JP)

(72) Inventor: Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/959,179

(22) Filed: Aug. 5, 2013

(65) Prior Publication Data

US 2014/0042582 A1    Feb. 13, 2014

(30) Foreign Application Priority Data

Aug. 8, 2012  (JP) ................................ 2012-175948

(51) Int. Cl.
*H01L 27/146* (2006.01)
*H01L 31/02* (2006.01)

(52) U.S. Cl.
CPC ............ *H01L 31/02* (2013.01); *H01L 27/1464* (2013.01); *H01L 27/14634* (2013.01); *H01L 27/14636* (2013.01)

(58) Field of Classification Search
USPC ......... 257/59, 72, E27.13, E27.134, E27.135, 257/E27.133, 222, 225, 292
See application file for complete search history.

(56) References Cited

U.S. PATENT DOCUMENTS

| 7,592,644 B2 * | 9/2009 | Suzuki et al. ................. 257/184 |
| 2002/0192919 A1 * | 12/2002 | Bothra .......................... 438/381 |
| 2008/0061216 A1 * | 3/2008 | Kasuga et al. ............. 250/208.1 |
| 2008/0231733 A1 * | 9/2008 | Fujioka et al. ................ 348/246 |
| 2010/0238334 A1 * | 9/2010 | Takahashi .................... 348/305 |
| 2011/0102657 A1 * | 5/2011 | Takahashi et al. ............ 348/308 |

FOREIGN PATENT DOCUMENTS

| JP | 2006-049361 A | 2/2006 |
| JP | 2010-219339 A | 9/2010 |

* cited by examiner

*Primary Examiner* — Cuong Q Nguyen
*Assistant Examiner* — Nishath Yasmeen
(74) *Attorney, Agent, or Firm* — Westerman, Hattori, Daniels & Adrian, LLP (57) ABSTRACT

A solid-state imaging apparatus in which a first substrate, a second substrate electrically connected to the first substrate through a connector and circuit elements disposed in the first substrate and in the second substrate, and forming pixels, each of the pixels includes a photoelectric conversion element disposed in the first substrate and configured to generate a signal corresponding to an amount of incident light, and a signal holder disposed in the second substrate in correspondence with the photoelectric conversion element and configured to hold an output signal corresponding to the signal generated by the corresponding photoelectric conversion element, and the signal holder is formed by laminating a capacitance element including a plurality of electrodes on a plurality of layers within the second substrate.

9 Claims, 7 Drawing Sheets

SOLID-STATE IMAGING APPARATUS AND IMAGING APPARATUS

BACKGROUND OF THE INVENTION

1. Field of the Invention

The present invention relates to a solid-state imaging apparatus and an imaging apparatus.

Priority is claimed on Japanese Patent Application No. 2012-175948, filed Aug. 8, 2012, the content of which is incorporated herein by reference.

2. Description of Related Art

Recently, imaging apparatuses such as video cameras and electronic still cameras have become popular. In these imaging apparatuses (hereinafter referred to as "cameras"), a charge coupled device (CCD) type solid-state imaging apparatus and an amplification type solid-state imaging apparatus are used. In the amplification type solid-state imaging apparatus, a plurality of pixels are disposed in a two-dimensional matrix shape. Accordingly, the amplification type solid-state imaging apparatus guides signal charges generated and accumulated by the photoelectric conversion section provided within a pixel on which light is incident to an amplification section provided within the pixel, and outputs a signal amplified by the amplification section as an output signal from the pixel.

An example of the amplification type solid-state imaging apparatus is a solid-state imaging apparatus using a junction field effect transistor in the amplification section, a complementary metal oxide semiconductor (CMOS) type solid-state imaging apparatus using a CMOS transistor in the amplification section, or the like.

In addition, in the related art, a scheme of sequentially reading signal charges generated and accumulated by the photoelectric conversion section of each pixel arranged in a two-dimensional matrix shape by row is adopted in a general CMOS type solid-state imaging apparatus (hereinafter referred to as "solid-state imaging apparatus"). In this read scheme, the timing of exposure in the photoelectric conversion section of each pixel is specified by the start and end of reading of signal charges, and an exposure timing of a pixel differs for every row.

As an exposure method, a simultaneous imaging function (hereinafter referred to as "global shutter function") of implementing the simultaneity of generation and accumulation of signal charges by exposing all pixels at the same timing is proposed. Accordingly, the use of the CMOS type solid-state imaging apparatus having the global shutter function is increasing.

In the CMOS type solid-state imaging apparatus having the global shutter function, it is generally necessary to have a storage capacitance section with a light blocking effect so as to accumulate signal charges generated by the photoelectric conversion section until a read operation ends. In the CMOS type solid-state imaging apparatus of the related art having the above-described global shutter function, signal charges generated by photoelectric conversion sections after all pixels have been simultaneously exposed are transferred to storage capacitance sections simultaneously in all pixels and temporarily accumulated. Thereafter, the signal charges accumulated in the storage capacitance section are sequentially converted into a pixel signal at a predetermined read timing and the pixel signal is read.

A solid-state imaging apparatus in which a MOS image sensor chip in which a micro-pad is formed on a wiring layer side for every unit cell and a signal processing chip in which a micro-pad is formed on a wiring layer side of a position corresponding to the micro-pad of the MOS image sensor chip are connected through a micro-bump has been disclosed (see Japanese Unexamined Patent Application, First Publication No. 2006-49361). In addition, a method of preventing an increase in a chip area of a solid-state imaging apparatus by bonding a first substrate on which a photoelectric conversion section is formed with a second substrate on which a plurality of MOS transistors are formed has been disclosed (see Japanese Unexamined Patent Application, First Publication No. 2010-219339). Even in the technology disclosed in Japanese Unexamined Patent Application, First Publication No. 2010-219339, the separately manufactured first and second substrates are electrically connected through a connection electrode.

In the technology disclosed in Japanese Unexamined Patent Application, First Publication No. 2006-49361, a cell of a MOS image sensor chip includes a photoelectric conversion element, an amplification transistor, and the like (see FIGS. 5 and 12 of Japanese Unexamined Patent Application, First Publication No. 2006-49361), and a cell of a signal processing chip has a configuration in which a signal output from the cell of the MOS image sensor chip is digitalized and stored in a memory (see FIGS. 8 and 9 of Japanese Unexamined Patent Application, First Publication No. 2006-49361).

In addition, in the technology disclosed in Japanese Unexamined Patent Application, First Publication No. 2010-219339, circuit elements constituting a pixel having the global shutter function of the related art are divided and disposed on two substrates (see FIG. 9 of Japanese Unexamined Patent Application, First Publication No. 2010-219339). Thus, an increase of a chip area can be avoided. In addition, because a phenomenon of noise moving from the MOS image sensor chip to the signal processing chip due to light incident on a pixel during a waiting period until signal charges accumulated in the storage capacitance section of the MOS image sensor chip are read is suppressed by forming a configuration in which first and second substrates are bonded, it is possible to prevent signal quality from being deteriorated due to the above-described noise.

SUMMARY OF THE INVENTION

According to a first embodiment of the present invention, there is provided a solid-state imaging apparatus in which a first substrate, a second substrate electrically connected to the first substrate through a connector and circuit elements disposed in the first substrate and in the second substrate, and forming pixels, wherein each of the pixels includes a photoelectric conversion element disposed in the first substrate and configured to generate a signal corresponding to an amount of incident light and a signal holder disposed in the second substrate in correspondence with the photoelectric conversion element and configured to hold an output signal corresponding to the signal generated by the corresponding photoelectric conversion element. The signal holder is formed by laminating a capacitance element including a plurality of electrodes on a plurality of layers within the second substrate.

According to a second embodiment of the present invention, in the solid-state imaging apparatus according to the first embodiment, each of the pixels further includes a noise suppression section disposed in the second substrate in correspondence with the photoelectric conversion element and used for cancellation of a noise component included in the signal generated by the corresponding photoelectric conversion element, and the noise suppression section includes: a noise suppression element formed by laminating a capacitance element including a plurality of electrodes on a plurality of layers within the second substrate.

According to a third embodiment of the present invention, in the solid-state imaging apparatus according to the second embodiment, the signal holder and the noise suppression element are formed by dividing a region of the same layer within the second substrate into a region of the signal holder and a region of the noise suppression element.

In addition, according to a fourth embodiment of the present invention, there is provided a solid-state imaging apparatus in which a first substrate, a second substrate electrically connected to the first substrate through a connector and circuit elements disposed in the first substrate and in the second substrate, and forming pixels, wherein each of the pixels includes a photoelectric conversion element disposed on the first substrate and configured to generate a signal corresponding to an amount of incident light, a noise suppression section including a noise suppression element disposed in the second substrate in correspondence with the photoelectric conversion element and used for cancellation of a noise component included in the signal generated by the photoelectric conversion element and a signal holder disposed on the second substrate in correspondence with the photoelectric conversion element and configured to hold a noise-canceled signal from which a noise component has been canceled by the noise suppression section. Each of the noise suppression element and the signal holder is a capacitance element including a plurality of electrodes, and is formed by laminating the noise suppression element and the signal holder within the second substrate.

According to a fifth embodiment of the present invention, in the solid-state imaging apparatus according to the fourth embodiment, each of the noise suppression element and the signal holder is divided and formed on a different layer within the second substrate in units of the noise suppression element and the signal holder.

According to a sixth embodiment of the present invention, in the solid-state imaging apparatus according to any one of the second to fifth embodiments, the signal holder has an electrode of one terminal connected to a clamp voltage for clamping the noise suppression element to a predetermined fixed potential when the noise suppression section cancels a noise component included in a signal generated by the corresponding photoelectric conversion element.

According to a seventh embodiment of the present invention, in the solid-state imaging apparatus according to any one of the first to sixth embodiments, the capacitance element is a capacitance element of a metal-insulator-metal (MIM) structure in which an insulator is interposed between electrodes.

According to an eighth embodiment of the present invention, in the solid-state imaging apparatus according to any one of the first to seventh embodiments, in the capacitance element, each of the plurality of electrodes forming the capacitance element is formed of a different material for each corresponding layer within the second substrate.

In addition, according to a ninth embodiment of the present invention, there is provided an imaging apparatus including a solid-state imaging apparatus in which a first substrate, a second substrate electrically connected to the first substrate through a connector and circuit elements disposed in the first substrate and in the second substrate, and forming pixels, wherein each of the pixels includes a photoelectric conversion element disposed in the first substrate and configured to generate a signal corresponding to an amount of incident light and a signal holder disposed in the second substrate in correspondence with the photoelectric conversion element and configured to hold an output signal corresponding to the signal generated by the corresponding photoelectric conversion element. The signal holder is formed by laminating a capacitance element including a plurality of electrodes on a plurality of layers within the second substrate.

In addition, according to a tenth embodiment of the present invention, there is provided an imaging apparatus including a solid-state imaging apparatus in which a first substrate, a second substrate electrically connected to the first substrate through a connector and circuit elements disposed in the first substrate and in the second substrate, and forming pixels, wherein each of the pixels includes a photoelectric conversion element disposed in the first substrate and configured to generate a signal corresponding to an amount of incident light, a noise suppression section including a noise suppression element disposed in the second substrate in correspondence with the photoelectric conversion element and used for cancellation of a noise component included in the signal generated by the corresponding photoelectric conversion element and a signal holder disposed on the second substrate in correspondence with the photoelectric conversion element and configured to hold a noise-canceled signal from which a noise component has been canceled by the noise suppression section. Each of the noise suppression element and the signal holder is a capacitance element including a plurality of electrodes, and is formed by laminating the noise suppression element and the signal holder within the second substrate.

DETAILED DESCRIPTION OF THE INVENTION

First Embodiment

Hereinafter, embodiments of the present invention will be described with reference to the drawings. The following description includes specific detailed contents as an example. However, those skilled in the art will understand that the detailed contents may be varied or modified and the variations and modifications of the contents are within the scope of the present invention. Accordingly, various exemplary embodiments of the present invention to be described hereinafter will be described without loss of generality of the present invention described in the claims and without limitation on the present invention.

Figure 1:
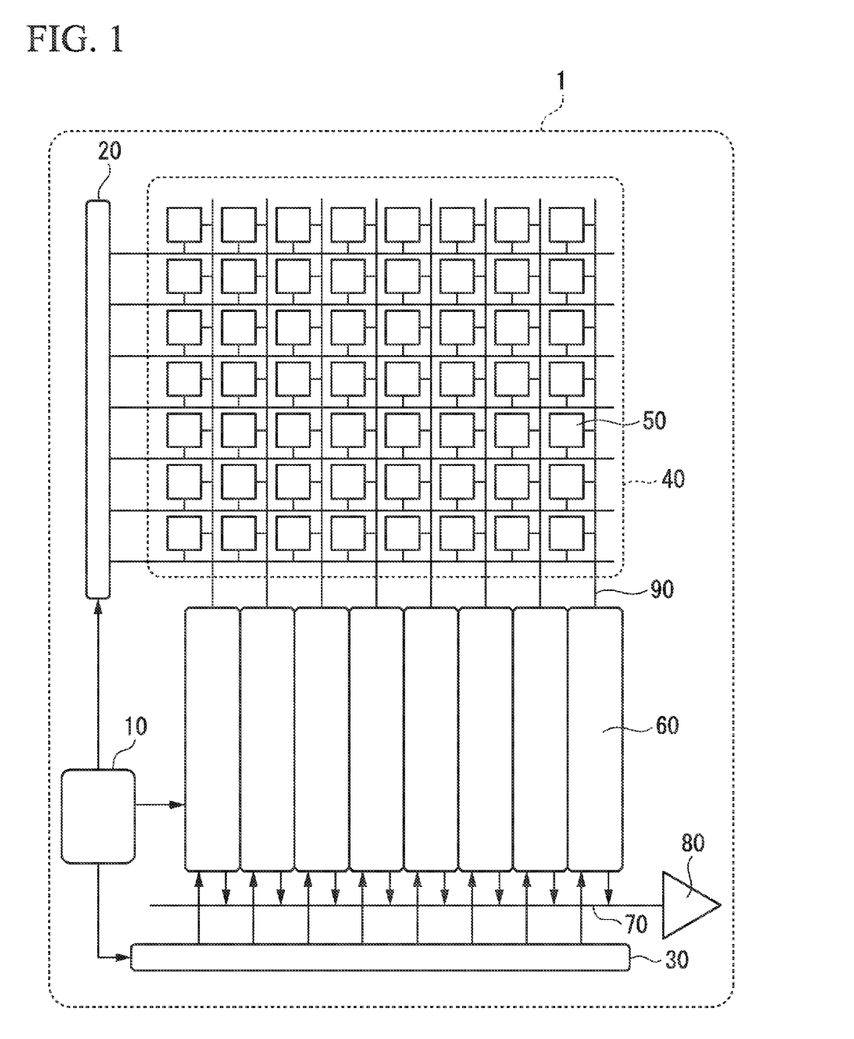
FIG. 1 is a block diagram illustrating a schematic configuration of a solid-state imaging apparatus according to a first embodiment of the present invention.

FIG. 1 is a block diagram illustrating a schematic configuration of a solid-state imaging apparatus according to the first embodiment of the present invention.

The solid-state imaging apparatus of the first embodiment of the present invention is a MOS type solid-state imaging apparatus that converts incident subject light into an electrical signal. In FIG. 1, the solid-state imaging apparatus 1 includes a control circuit 10, a vertical scanning circuit 20, a horizontal scanning circuit 30, a pixel array section 40 formed by a plurality of unit pixels 50, a column signal processing circuit 60, and an output amplifier 80. In the solid-state imaging apparatus 1 illustrated in FIG. 1, an example of the pixel array section 40 in which the plurality of unit pixels 50 are two-dimensionally disposed in 7 rows and 8 columns is illustrated.

The control circuit 10 controls the vertical scanning circuit 20, the horizontal scanning circuit 30, and the column signal processing circuit 60.

The vertical scanning circuit 20 controls each unit pixel 50 within the pixel array section 40 according to control from the control circuit 10, and causes a pixel signal of each unit pixel 50 to be output to a vertical signal line 90.

The vertical scanning circuit 20 outputs a control signal for controlling the unit pixel 50 to each row of the unit pixel 50 provided in the pixel array section 40. A method of controlling the unit pixel 50 by the vertical scanning circuit 20 will be described in detail later.

Each unit pixel 50 within the pixel array section 40 converts incident subject light into a pixel signal, and outputs a pixel signal corresponding to the incident subject light to the vertical signal line 90 according to the control signal input from the vertical scanning circuit 20. Circuit elements constituting each unit pixel 50 are disposed on the first and second substrates, and the first substrate and the second substrate are connected within the unit pixel 50. The unit pixel 50 will be described in detail later.

The column signal processing circuit 60 is disposed in each column of the pixel array section 40, and performs circuit processing such as noise suppression on a pixel signal output from the unit pixel 50 of each column to each vertical signal line 90 according to control from the control circuit 10. For example, the column signal processing circuit 60 is a processing circuit of correlated double sampling (CDS), signal amplification, analog-to-digital (AD) conversion, or the like. According to control from the horizontal scanning circuit 30, the column signal processing circuit 60 outputs an output signal obtained by processing a pixel signal to a horizontal signal line 70.

The horizontal scanning circuit 30 sequentially reads a processed output signal output from the column signal processing circuit 60 disposed in each column to the horizontal signal line 70. The output signal from the column signal processing circuit 60 read to the horizontal signal line 70 is output outside the solid-state imaging apparatus 1 via the output amplifier 80.

Figure 2:
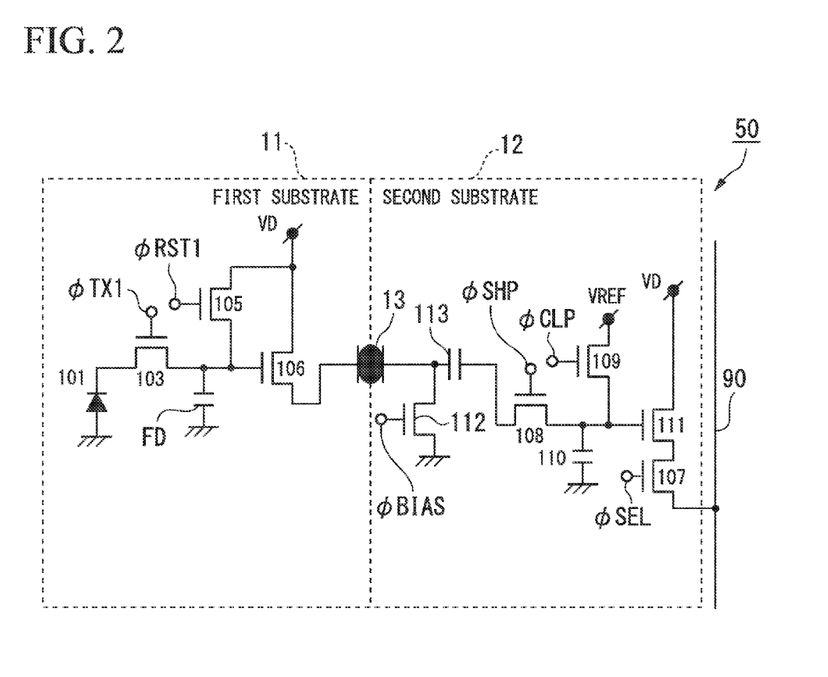
FIG. 2 is a circuit diagram illustrating a schematic configuration of a unit pixel within a pixel array section of the solid-state imaging apparatus of the first embodiment of the present invention.

Next, the unit pixel 50 provided in the pixel array section 40 within the solid-state imaging apparatus 1 of the first embodiment of the present invention will be described. FIG. 2 is a circuit diagram illustrating a schematic configuration of the unit pixel 50 within the pixel array section 40 of the solid-state imaging apparatus 1 of the first embodiment of the present invention. In FIG. 2, one unit pixel 50 is illustrated. The unit pixel 50 converts incident subject light into a pixel signal, and outputs the pixel signal to the vertical signal line 90. As illustrated in FIG. 2, the unit pixel 50 is disposed by dividing circuit elements within each unit pixel 50 into a pixel section 11 of the first substrate and a storage circuit 12 of the second substrate.

In FIG. 2, the unit pixel 50 includes a photoelectric conversion section 101, a transfer transistor 103, a pixel reset transistor 105, and a first amplification transistor 106 formed in the pixel section 11 of the first substrate, and a selection transistor 107, an intra-pixel sample and hold transistor 108, an intra-pixel clamp transistor 109, a signal holder 110, a second amplification transistor 111, a pixel load transistor 112, and a noise suppression element 113 formed in the storage circuit 12 of the second substrate. In addition, the pixel section 11 of the first substrate and the storage circuit 12 of the second substrate are connected through an inter-substrate connector 13.

The inter-substrate connector 13 is a connector for electrically connecting the first and second substrates. As the inter-substrate connector 13, for example, a bump or the like manufactured by a vapor deposition method or a plating method is used.

A space between the first and second substrates may be filled with an insulating member such as an adhesive. The first and second substrates transmit and receive a signal through the inter-substrate connector 13. In the unit pixel 50 illustrated in FIG. 2, the first amplification transistor 106 within the pixel section 11 of the first substrate and the pixel load transistor 112 and the noise suppression element 113 within the storage circuit 12 of the second substrate are connected via the inter-substrate connector 13.

The photoelectric conversion section 101 is a photoelectric conversion element which generates signal charges by photoelectrically converting incident light and accumulates the generated signal charges as a photoelectrically converted signal.

The transfer transistor 103 transfers the photoelectrically converted signal accumulated in the photoelectric conversion section 101 to a gate terminal of the first amplification transistor 106 according to a control signal φTX1 input from the vertical scanning circuit 20. At this time, the photoelectrically converted signal transferred by the transfer transistor 103 is accumulated in a node capacitor FD.

The node capacitor FD is a capacitor attached to a node connected to the gate terminal of the first amplification transistor 106, and is denoted by a symbol of a capacitor in a schematic configuration of the unit pixel 50 illustrated in FIG. 2.

The first amplification transistor 106 outputs the photoelectrically converted signal transferred to the gate terminal, that is, a signal voltage corresponding to the photoelectrically converted signal accumulated in the node capacitor FD, to the inter-substrate connector 13. Thereby, the signal voltage corresponding to the photoelectrically converted signal of the photoelectric conversion section 101 is read to the storage circuit 12 of the second substrate via the inter-substrate connector 13.

The pixel reset transistor 105 resets the photoelectrically converted signal within the unit pixel 50 to a power supply voltage VD according to a control signal φRST1 input from the vertical scanning circuit 20.

The pixel load transistor 112 operates as a load of the first amplification transistor 106, which outputs a signal voltage, according to a control signal φBIAS input from the vertical scanning circuit 20. The pixel load transistor 112 supplies the first amplification transistor 106 with a current for driving the first amplification transistor 106 which outputs the signal voltage.

The noise suppression element 113 is a capacitor which holds (accumulates) the signal voltage output from the first amplification transistor 106.

According to a control signal φCLP input from the vertical scanning circuit 20, the intra-pixel clamp transistor 109 clamps the signal holder 110 and the noise suppression element 113 to a fixed potential VREF. Thereby, the signal holder 110 and the noise suppression element 113 hold the clamped fixed potential VREF.

The intra-pixel sample and hold transistor 108 causes a signal to be held in the signal holder 110 according to a control signal φSHP input from the vertical scanning circuit 20.

The signal holder 110 is a capacitor which holds (accumulates) a signal voltage input via the intra-pixel sample and hold transistor 108 (a signal from which a noise component has been canceled within the unit pixel 50).

According to configurations of the pixel load transistor 112, the intra-pixel clamp transistor 109, the intra-pixel sample and hold transistor 108, the signal holder 110, and the noise suppression element 113 in the unit pixel 50, a noise cancellation process of canceling a noise component due to a leak current (dark current) is performed within the unit pixel 50. Accordingly, the signal holder 110 holds (accumulates) a signal subjected to the noise cancellation process.

It is more desirable to use a capacitor of an MIM structure, which is a capacitor in which a leak current (dark current) per unit area is small, a capacitor of a polysilicon-insulator-polysilicon (PIP) structure, a capacitor of a MOS structure as the signal holder 110. Thereby, it is possible to improve resistance to noise and obtain a high-quality signal. A method of forming the signal holder 110 within the storage circuit 12 of the second substrate will be described in detail later.

The second amplification transistor 111 outputs a voltage of the gate terminal, that is, a signal voltage corresponding to a signal subjected to the noise cancellation process (hereinafter referred to as a noise-canceled signal) accumulated in the signal holder 110

The selection transistor 107 outputs a signal voltage output from the second amplification transistor 111 as a pixel signal output by the unit pixel 50 to the vertical signal line 90 according to a control signal φSEL input from the vertical scanning circuit 20. Thereby, the pixel signal corresponding to the photoelectrically converted signal of the photoelectric conversion section 101 is read to the vertical signal line 90.

In each unit pixel 50 in the solid-state imaging apparatus 1 by the above-described configuration, a signal voltage corresponding to a photoelectrically converted signal obtained by the photoelectric conversion section 101 photoelectrically converting incident light is read to the storage circuit 12 of the second substrate via the inter-substrate connector 13, and a signal (noise-canceled signal) of which noise has been suppressed in the storage circuit 12 of the second substrate is held (accumulated) in the signal holder 110. Thereafter, in the solid-state imaging apparatus 1, the signal voltage corresponding to the noise-canceled signal accumulated in the signal holder 110 of each unit pixel 50 is sequentially read as the pixel signal to the vertical signal line 90.

Figure 3:
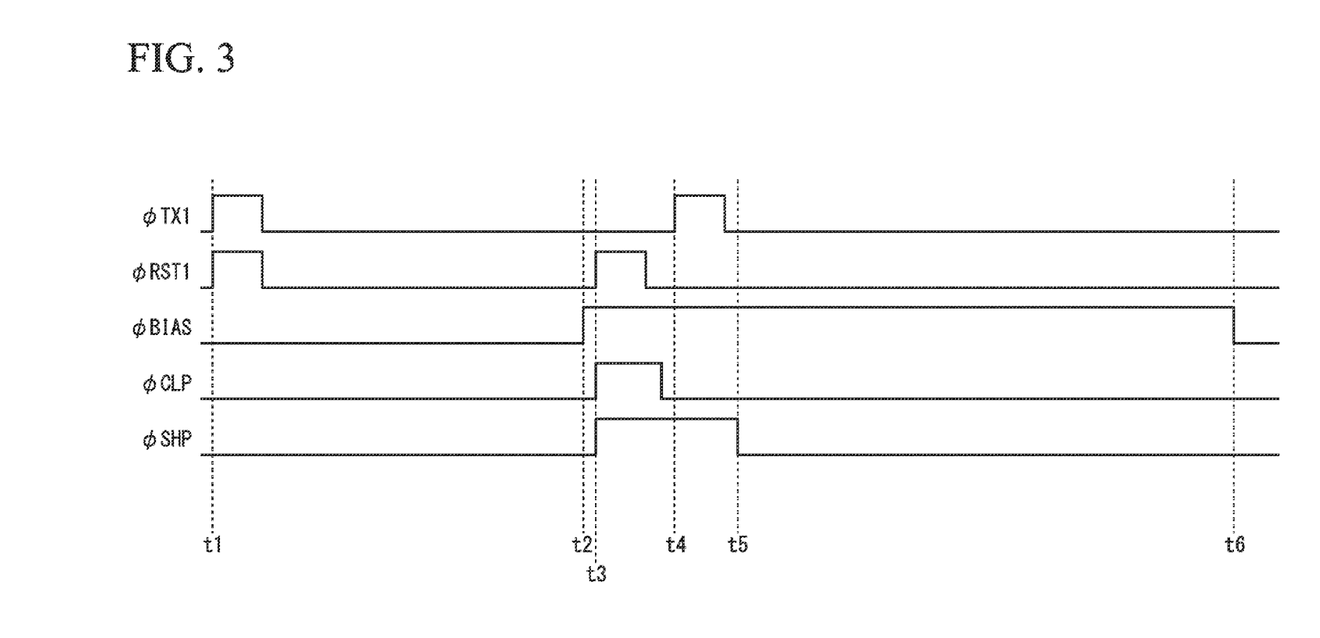
FIG. 3 is a timing chart illustrating timings at which the unit pixel within the pixel array section of the solid-state imaging apparatus of the first embodiment of the present invention is driven.

Next, drive timings of the unit pixel 50 within the solid-state imaging apparatus 1 of the first embodiment of the present invention will be described. FIG. 3 is a timing chart illustrating timings at which the unit pixel 50 within the pixel array section 40 of the solid-state imaging apparatus 1 of the first embodiment of the present invention is driven. The timing chart illustrated in FIG. 3 illustrates timings of one unit pixel 50 controlled by the vertical scanning circuit 20 in an operation of the pixel array section 40 in which all unit pixels 50 are simultaneously exposed to light and a pixel signal of each row is sequentially output to the vertical signal line 90.

First, at a time t1, all the unit pixels 50 within the pixel array section 40 are reset.

More specifically, at the time t1, the vertical scanning circuit 20 turns on the transfer transistor 103 and the pixel reset transistor 105 by simultaneously setting the control signal φTX1 and the control signal φRST1 to a "high (H)" level. Thereby, photoelectric conversion sections 101 and node capacitors FD disposed in all the unit pixels 50 within the pixel array section 40 are reset.

Thereafter, the vertical scanning circuit 20 releases the reset of all the unit pixels 50 within the pixel array section 40 by simultaneously setting the control signal φTX1 and the control signal φRST1 to a "low (L)" level. Thereby, all the unit pixels 50 within the pixel array section 40 simultaneously start to be exposed to light. That is, the photoelectric conversion sections 101 disposed in all the unit pixels 50 within the pixel array section 40 start to accumulate photoelectrically converted signals obtained by photoelectrically converting incident light.

Subsequently, after a given period has elapsed, that is, after an arbitrary exposure time has elapsed, a noise cancellation process of reading a reset level signal and a photoelectrically converted signal of each unit pixel 50 within the pixel array section 40 to the storage circuit 12 of the second substrate and finding a difference between the reset level signal and the photoelectrically converted signal is performed from a time t2.

More specifically, at the time t2, the vertical scanning circuit 20 causes the pixel load transistor 112 to operate as a load of the first amplification transistor 106 by controlling a control signal φBIAS. Subsequently, at a time t3, the vertical scanning circuit 20 turns on the pixel reset transistor 105 by setting the control signal φRST1 to the "H" level, and resets the node capacitor FD. Thereby, a signal voltage of the reset level of the photoelectric conversion section 101 from the first amplification transistor 106 is output to the noise suppression element 113 of the storage circuit 12 of the second substrate via the inter-substrate connector 13. In addition, the vertical scanning circuit 20 turns on the intra-pixel clamp transistor 109 and the intra-pixel sample and hold transistor 108 by setting the control signal φCLP and the control signal φSHP to the "H" level, and clamps the signal holder 110 and the noise suppression element 113.

Thereafter, the vertical scanning circuit 20 releases the reset of the node capacitor FD by setting the control signal φRST1 to the "L" level, and releases the clamp of the signal holder 110 by setting the control signal φCLP to the "L" level.

Subsequently, at a time t4, the vertical scanning circuit 20 turns on the transfer transistor 103 by setting the control signal φTX1 to the "H" level and transfers the photoelectrically converted signal accumulated in the photoelectric conversion section 101 to the gate terminal of the first amplification transistor 106. At this time, the photoelectrically converted signal transferred by the transfer transistor 103 is accumulated in the node capacitor FD. Thereby, a signal voltage corresponding to the photoelectrically converted signal generated by the photoelectric conversion section 101, that is, the photoelectrically converted signal accumulated in the node capacitor FD, is output from the first amplification transistor 106 to the noise suppression element 113 via the inter-substrate connector 13. Accordingly, the noise suppression element 113 outputs a difference between a signal voltage of the reset level of the photoelectric conversion section 101 and a signal voltage corresponding to the photoelectrically converted signal generated by the photoelectric conversion section 101, that is, a signal voltage corresponding to the noise-canceled signal subjected to the noise cancellation process.

Thereafter, the vertical scanning circuit 20 stops a transfer of the photoelectrically converted signal accumulated by the photoelectric conversion section 101 to the gate terminal of the first amplification transistor 106 by setting the control signal φTX1 to the "L" level, and stops a sample and hold operation of the signal holder 110 by setting the control signal φSHP to the "L" level at a time t5. Thereby, the signal holder 110 holds (accumulates) a signal voltage corresponding to the noise-canceled signal output by the noise suppression element 113. By this point, photoelectrically converted signals of the photoelectric conversion sections 101 disposed in all the unit pixels 50 within the pixel array section 40 have been subjected to the noise cancellation process and held (accumulated) in the signal holder 110.

Subsequently, at a time t6, the vertical scanning circuit 20 stops an operation as a load of the first amplification transistor 106 of the pixel load transistor 112 by controlling the control signal φBIAS.

Thereafter, the vertical scanning circuit 20 causes a signal voltage corresponding to a noise-canceled signal held (accumulated) in the signal holder 110 to be sequentially output to the vertical signal line 90 by sequentially controlling the control signal φSEL row by row.

According to the above-described drive timings, in unit pixels 50 provided in the pixel array section 40 within the solid-state imaging apparatus 1 of the first embodiment of the present invention, results of noise cancellation processes are held (accumulated) in the signal holder 110 by performing the noise cancellation processes on photoelectrically converted signals of the photoelectric conversion sections 101 disposed in all the unit pixels 50, and signal voltages subjected to the noise cancellation processes are sequentially output as pixel signals to the vertical signal line 90. At this time, in the solid-state imaging apparatus 1 of the first embodiment of the present invention, operations of reading photoelectrically converted signals from the photoelectric conversion sections 101 disposed in all the unit pixels 50 are simultaneously performed and an operation of a global shutter function is performed.

When capacitance values of the signal holder 110 and the noise suppression element 113 are large in the unit pixel 50 illustrated in FIG. 2, it is possible to suppress noise generated at the time of an operation of suppressing the noise (an operation of the noise cancellation process) or a leak current generated during a waiting period in which a noise-suppressed signal (noise-canceled signal) is held in the signal holder 110. In the solid-state imaging apparatus 1 of the first embodiment of the present invention, each capacitor is formed so that capacitance values of the signal holder 110 and the noise suppression element 113 within the unit pixel 50 are large.

Figure 4:
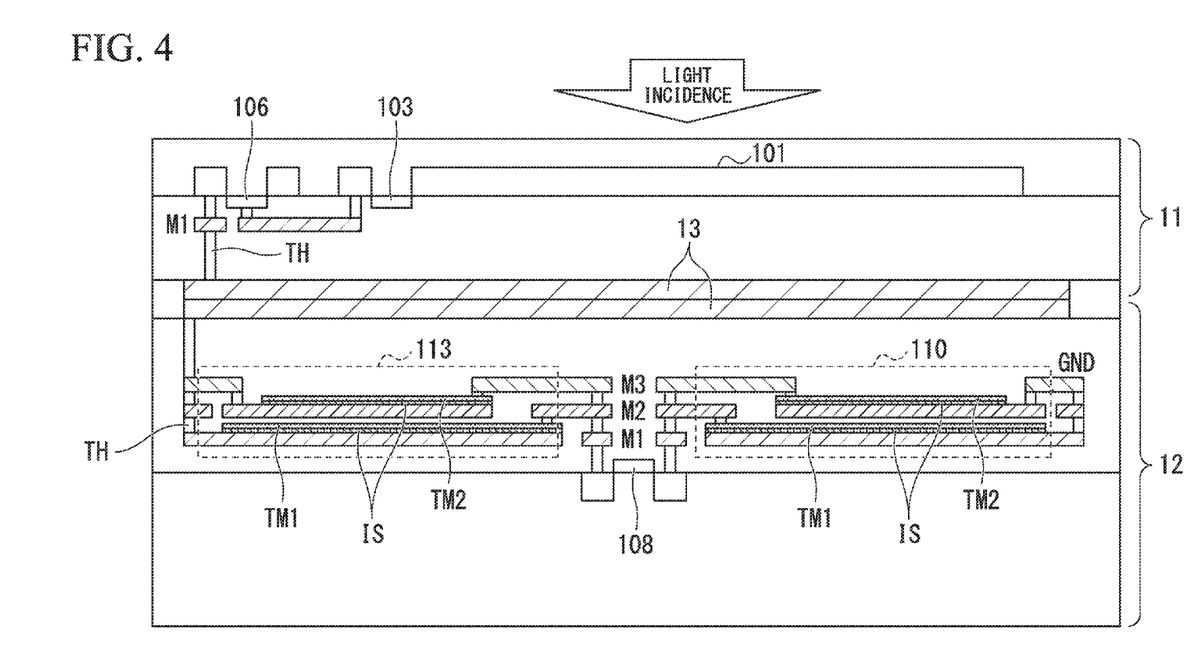
FIG. 4 is a vertical structure diagram illustrating a structure of a unit pixel within the pixel array section of the solid-state imaging apparatus of the first embodiment of the present invention.

Here, a method of forming the signal holder 110 and the noise suppression element 113 within the storage circuit 12 of the second substrate will be described. FIG. 4 is a vertical structure diagram illustrating a structure of the unit pixel 50 within the pixel array section 40 of the solid-state imaging apparatus 1 of the first embodiment of the present invention. In FIG. 4, part of the circuit of the unit pixel 50 illustrated in FIG. 2 is illustrated and the same reference signs are assigned to corresponding circuit elements. More specifically, in the unit pixel 50, the photoelectric conversion section 101, the transfer transistor 103, and the first amplification transistor 106 formed in the pixel section 11 of the first substrate, the intra-pixel sample and hold transistor 108, the signal holder 110, and the noise suppression element 113 formed in the storage circuit 12 of the second substrate, and the inter-substrate connector 13 connecting the pixel section 11 of the first substrate and the storage circuit 12 of the second substrate are shown. Hereinafter, the case in which the signal holder 110 and the noise suppression element 113 within the unit pixel 50 are formed by an MIM capacitance element (capacitor) will be described.

In FIG. 4, M1, M2, and M3 denote different metal wiring layers, and TH denotes a so-called intra-substrate connector such as a VIA or a contact through which different wiring layers are connected. In addition, in FIG. 4, TM1 denotes the other electrode (upper electrode) when a capacitance element having a metal wiring layer M1 as one electrode (lower electrode) is formed, TM2 denotes the other electrode (upper electrode) when a capacitance element having a metal wiring layer M2 as one electrode (lower electrode) is formed, and IS denotes a dielectric (insulator) when the capacitance element is formed. That is, the metal wiring layer M1, which is the lower electrode, the dielectric IS, and the upper electrode TM1 form one MIM capacitance element (capacitor) (hereinafter referred to as "M1-TM1 capacitor"), and the metal wiring layer M2, which is the lower electrode, the dielectric IS, and the upper electrode TM2 form one MIM capacitance element (capacitor) (hereinafter referred to as "M2-TM2 capacitor"). The materials of the upper electrode TM1 and the upper electrode TM2 may be different from those of the lower electrodes (metal wirings).

As illustrated in FIG. 4, three metal wiring layers of the metal wiring layers M1, M2, and M3 are formed on the second substrate. Accordingly, within the second substrate, each of the signal holder 110 and the noise suppression element 113 is formed by a configuration in which two MIM capacitance elements (capacitors) of an M1-TM1 capacitor formed on a first layer and an M2-TM2 capacitor formed on a second layer are combined (laminated).

As described above, in the unit pixel 50 provided in the pixel array section 40 within the solid-state imaging apparatus 1 of the first embodiment of the present invention, each of the signal holder 110 and the noise suppression element 113 is formed by laminating the capacitance element formed by a plurality of different layers. At this time, in the unit pixel 50, a region of the same layer forming each of the signal holder 110 and the noise suppression element 113 is divided into a region of the signal holder 110 and a region of the noise suppression element 113 and disposed. Thereby, in the unit pixel 50 of the solid-state imaging apparatus 1 of the first embodiment of the present invention, it is possible to increase a capacitance value by further increasing an area of each of the signal holder 110 and the noise suppression element 113 than when the signal holder 110 and the noise suppression element 113 are formed in the same planar region as in the solid-state imaging apparatus of the related art without increasing a chip area of the solid-state imaging apparatus 1. Thereby, in each unit pixel 50 in the solid-state imaging apparatus 1 of the first embodiment of the present invention, it is possible to suppress noise generated at the time of an operation of suppressing the noise (an operation of the noise cancellation process) or a leak current generated during a waiting period in which a noise-suppressed signal (noise-canceled signal) is held in the signal holder 110 and to suppress the deterioration of signal quality.

In addition, in the unit pixel 50 provided in the pixel array section 40 within the solid-state imaging apparatus 1 of the first embodiment of the present invention, it is possible to suppress relative variations of the noise suppression element 113 and the signal holder 110 by laminating a capacitance element formed by a plurality of different layers to configure each of the noise suppression element 113 and the signal holder 110. Thereby, in the solid-state imaging apparatus 1 of the first embodiment of the present invention, it is possible to suppress noise due to variation in a capacitance ratio between the noise suppression element 113 and the signal holder 110 and suppress the deterioration of signal quality.

Because the unit pixel 50 is configured to include the noise suppression element 113 in the solid-state imaging apparatus 1 of the first embodiment of the present invention, each of the noise suppression element 113 and the signal holder 110 is configured by laminating a capacitance element formed by a plurality of different layers. However, even when a configuration is made without the noise suppression element 113 in the unit pixel 50, it is possible to improve resistance to noise of the signal holder 110 by laminating a capacitance element formed by a plurality of different layers to configure the signal holder 110.

In addition, although the case in which each of the noise suppression element 113 and the signal holder 110 is formed by laminating capacitance elements formed on two layers in the example illustrated in FIG. 4 has been described, the number of capacitance elements to be laminated when each of the noise suppression element 113 and the signal holder 110 is formed is not limited to the configuration of the example illustrated in FIG. 4. For example, it is possible to increase a capacitance value and suppress the deterioration of signal quality by further increasing an area of each of the noise suppression element 113 and the signal holder 110 than when the noise suppression element 113 and the signal holder 110 are formed in the same planar region by increasing the number of metal wiring layers to be configured on the second substrate and laminating the MIM capacitance element (capacitor) formed on a third or fourth layer in similar technology.

In addition, although the case in which the MIM capacitance element (capacitor) is laminated in the example illustrated in FIG. 4 has been described, the laminated capacitance element is not limited to the MIM capacitance element of the example illustrated in FIG. 4. A similar concept can also be applied to a PIP capacitance element, a MOS capacitance element, or the like. In addition, a configuration can be formed by combining the MIM capacitance element, the PIP capacitance element, and the MOS capacitance element.

Because light is incident from a surface of a side on which a wiring layer is formed to the photoelectric conversion section in the normal solid-state imaging apparatus, the incident light for the photoelectric conversion section is blocked by increasing the wiring layer. In addition, because a process of forming the wiring layer is performed after a process of forming the photoelectric conversion section in the normal solid-state imaging apparatus, the photoelectric conversion section already formed in the process of forming the wiring layer may be damaged. Thus, when the wiring layer is increased in the normal solid-state imaging apparatus, the signal quality is likely to be deteriorated. However, in the solid-state imaging apparatus 1 of the first embodiment of the present invention, the wiring layer of the second substrate which is different from the first substrate on which the photoelectric conversion section 101 is formed, that is, the capacitance layer forming the capacitance element, is increased. In addition, as illustrated in FIG. 4, the photoelectric conversion section 101 is configured with a backside illumination (BSI) in which light is incident from an opposite side of the wiring layer. Thereby, the solid-state imaging apparatus 1 of the first embodiment of the present invention also has an advantage in that there is no negative effect on signal quality when the number of wiring layers is increased.

Second Embodiment

Next, the solid-state imaging apparatus of the second embodiment will be described. The solid-state imaging apparatus of the second embodiment of the present invention is only different from the solid-state imaging apparatus 1 of the first embodiment in terms of the method of forming the signal holder 110 and the noise suppression element 113 formed in the storage circuit 12 of the second substrate. That is, the configuration of the solid-state imaging apparatus of the second embodiment of the present invention, the circuit configuration of the unit pixel provided in the pixel array section within the solid-state imaging apparatus of the second embodiment of the present invention, and the drive timings of the unit pixel are substantially the same as the configuration of the solid-state imaging apparatus 1 of the first embodiment illustrated in FIGS. 1 to 3, the circuit configuration of the unit pixel 50 and the drive timings of the unit pixel 50. Accordingly, hereinafter, components similar to those of the solid-state imaging apparatus 1 of the first embodiment among components of the solid-state imaging apparatus of the second embodiment of the present invention will be described using the same reference signs. A detailed description of the configuration of the solid-state imaging apparatus of the second embodiment of the present invention, the circuit configuration of the unit pixel provided in the pixel array section within the solid-state imaging apparatus of the second embodiment of the present invention, and the drive timings of the unit pixel are omitted here. Hereinafter, the unit pixel provided in the pixel array section 40 within the solid-state imaging apparatus 1 of the second embodiment of the present invention will be described as a "unit pixel 52."

Figure 5:
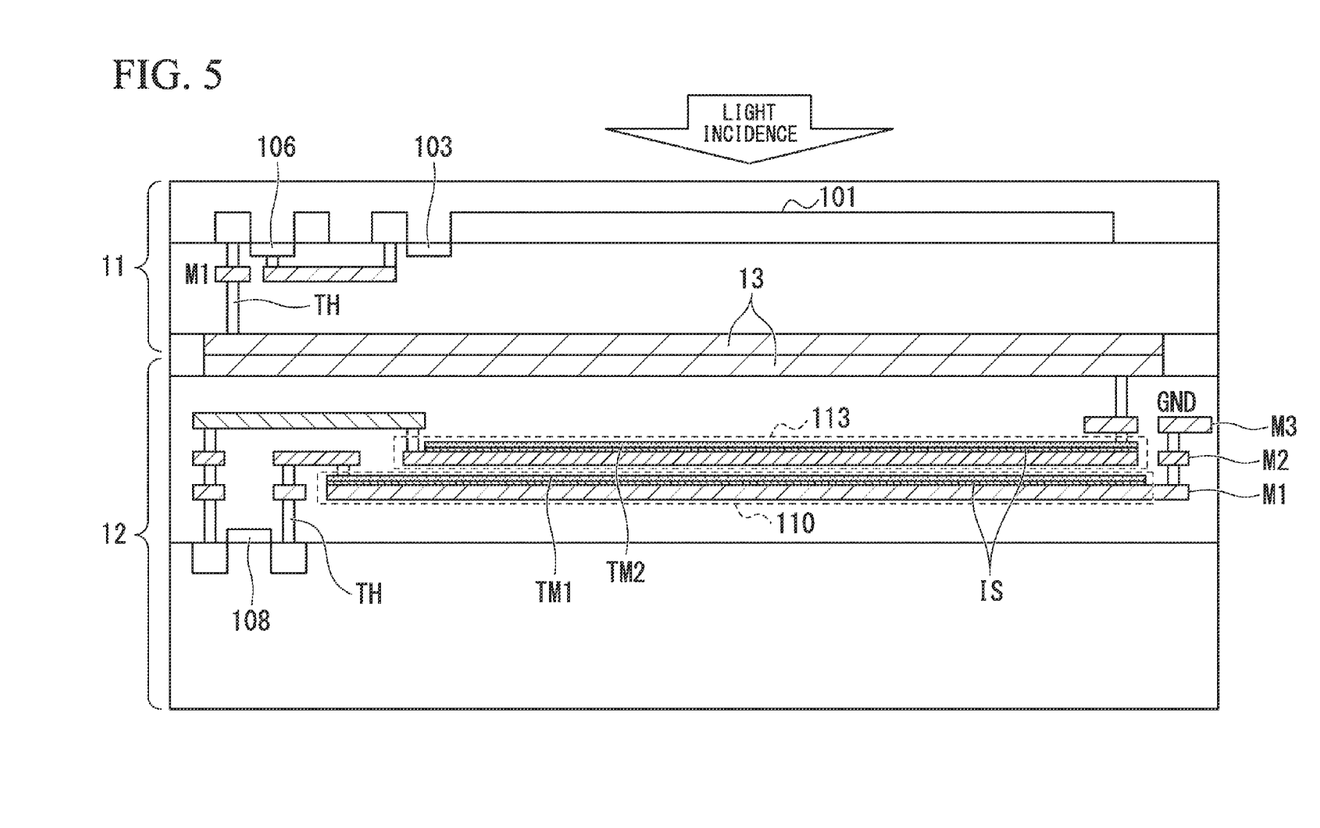
FIG. 5 is a vertical structure diagram illustrating a structure of a unit pixel within a pixel array section of a solid-state imaging apparatus of a second embodiment of the present invention.

Even in the solid-state imaging apparatus 1 of the second embodiment of the present invention, each capacitor is formed so that capacitance values of the signal holder 110 and the noise suppression element 113 within the unit pixel 52 are increased. FIG. 5 is a vertical structure diagram illustrating a structure of the unit pixel 52 within the pixel array section 40 of the solid-state imaging apparatus 1 of the second embodiment of the present invention. Even in FIG. 5, part of the circuit of the unit pixel 52 is illustrated. As in the vertical structure diagram of the unit pixel 50 illustrated in FIG. 4, the photoelectric conversion section 101, the transfer transistor 103, and the first amplification transistor 106 formed in the pixel section 11 of the first substrate, the intra-pixel sample and hold transistor 108, the signal holder 110, and the noise suppression element 113 formed in the storage circuit 12 of the second substrate, and the inter-substrate connector 13 connecting the pixel section 11 of the first substrate and the storage circuit 12 of the second substrate are shown. Hereinafter, as in the solid-state imaging apparatus 1 of the first embodiment, the case in which the signal holder 110 and the noise suppression element 113 within the unit pixel 52 are formed by an MIM capacitance element (capacitor) will be described.

Even in the solid-state imaging apparatus 1 of the second embodiment of the present invention, as in the solid-state imaging apparatus 1 of the first embodiment, the second substrate includes three metal wiring layers of metal wiring layers M1, M2, and M3 and each of the signal holder 110 and the noise suppression element 113 is laminated and configured within the second substrate. However, in the solid-state imaging apparatus 1 of the second embodiment of the present invention, unlike the solid-state imaging apparatus 1 of the first embodiment, each of the signal holder 110 and the noise suppression element 113 is formed by an MIM capacitance element (capacitor) of one layer, and each MIM capacitance element (capacitor) is laminated and disposed.

More specifically, as illustrated in FIG. 5, an M1-TIM1 capacitor in which the signal holder 110 is formed on a first layer is formed and an M2-TIM2 capacitor in which the noise suppression element 113 is formed on a second layer is formed. Accordingly, two MIM capacitance elements (capacitors) of the M1-TM1 capacitor (signal holder 110) formed on the first layer and the M2-TM2 capacitor (noise suppression element 113) formed on the second layer are laminated.

As described above, in the unit pixel 52 provided in the pixel array section 40 within the solid-state imaging apparatus 1 of the second embodiment of the present invention, each of the signal holder 110 and the noise suppression element 113 is used and laminated as a capacitance element formed in one layer in units of capacitance elements, that is, units of the signal holder 110 and the noise suppression element 113. Thereby, even in the unit pixel 52 of the solid-state imaging apparatus 1 of the second embodiment of the present invention, as in the solid-state imaging apparatus 1 of the first embodiment, it is possible to increase a capacitance value by further increasing an area of each of the signal holder 110 and the noise suppression element 113 than when the signal holder 110 and the noise suppression element 113 are formed in the same planar region as in the solid-state imaging apparatus of the related art without increasing a chip area of the solid-state imaging apparatus 1. Thereby, even in the solid-state imaging apparatus 1 of the second embodiment of the present invention, as in the solid-state imaging apparatus 1 of the first embodiment, it is possible to suppress noise generated at the time of an operation of suppressing the noise (an operation of the noise cancellation process) or a leak current generated during a waiting period in which a noise-suppressed signal (noise-canceled signal) is held in the signal holder 110 and to suppress the deterioration of signal quality in each unit pixel 52.

In addition, in the unit pixel 52 provided in the pixel array section 40 within the solid-state imaging apparatus 1 of the second embodiment of the present invention, it is possible to further decrease the intra-substrate connector TH within the second substrate than in the solid-state imaging apparatus 1 of the first embodiment by forming each of the noise suppression element 113 and the signal holder 110 on one layer. Thereby, in the unit pixel 52 of the solid-state imaging apparatus 1 of the second embodiment of the present invention, a region used in the intra-substrate connector TH in the solid-state imaging apparatus 1 of the first embodiment can be used as a region of a capacitance element. Thereby, in the solid-state imaging apparatus 1 of the second embodiment of the present invention, it is possible to increase the capacitance value and suppress the deterioration of signal quality by further increasing the area of the noise suppression element 113 or the signal holder 110 to be formed in the same planar region than in the solid-state imaging apparatus 1 of the first embodiment.

Although the case in which each of the capacitance elements formed on each of the two layers is laminated as the noise suppression element 113 or the signal holder 110 has been described in an example illustrated in FIG. 5, it is possible to apply a concept similar to that of the solid-state imaging apparatus 1 of the first embodiment and configure each of the signal holder 110 and the noise suppression element 113 with a plurality of capacitance elements formed by a plurality of different layers if lamination is performed in units of the signal holder 110 and the noise suppression element 113.

For example, it is possible to further increase an area of each of the signal holder 110 and the noise suppression element 113 to increase a capacitance value by increasing the number of metal wiring layers formed on the second substrate, further applying a concept similar to that of the solid-state imaging apparatus 1 of the first embodiment, setting two MIM capacitance elements (capacitors) formed on first and second layers as the signal holder 110, and setting two MIM capacitance elements (capacitors) formed on third and fourth layers as the noise suppression element 113. Even in this case, as in the solid-state imaging apparatus 1 of the first embodiment, there is an advantage in that there is no negative effect on signal quality due to an increase in the number of wiring layers.

In addition, although the case in which MIM capacitance elements (capacitors) are laminated has been described in the example illustrated in FIG. 5, the capacitance element to be laminated is not limited to the MIM capacitance element of the example illustrated in FIG. 5. As in the solid-state imaging apparatus 1 of the first embodiment, it is possible to apply a similar concept to the PIP capacitance element, the MOS capacitance element, and the like or make a configuration by combining the MIM capacitance element, the PIP capacitance element, and the MOS capacitance element.

Third Embodiment

When a potential difference between electrodes increases in relation to the signal holder 110, a leak current generated between the electrodes increases. Normally, the leak current generated between the electrodes of the signal holder 110 is considered not to be large enough to have a negative effect on signal quality. However, the leak current generated between the electrodes also increases in proportion to an increase in the capacitance value of the signal holder 110, and may have a negative effect on signal quality. Hereinafter, the solid-state imaging apparatus of the third embodiment which suppresses the leak current generated between the electrodes of the signal holder 110 will be described.

In the solid-state imaging apparatus of the third embodiment of the present invention, only a circuit configuration of a unit pixel provided in the pixel array section is different from the circuit configurations of the unit pixel 50 provided in the pixel array section 40 within the solid-state imaging apparatus 1 of the first embodiment illustrated in FIG. 1 and the unit pixel 52 within the solid-state imaging apparatus 1 of the second embodiment. That is, components other than the unit pixel of the solid-state imaging apparatus of the third embodiment of the present invention are substantially the same as those of the solid-state imaging apparatuses 1 of the first and second embodiments. Accordingly, components similar to those of the solid-state imaging apparatus 1 of the first embodiment illustrated in FIG. 1 among the components of the solid-state imaging apparatus of the third embodiment of the present invention are assigned the same reference signs and description thereof is omitted. Hereinafter, the unit pixel provided in the pixel array section 40 within the solid-state imaging apparatus 1 of the third embodiment of the present invention will be described as a "unit pixel 53."

Figure 6:
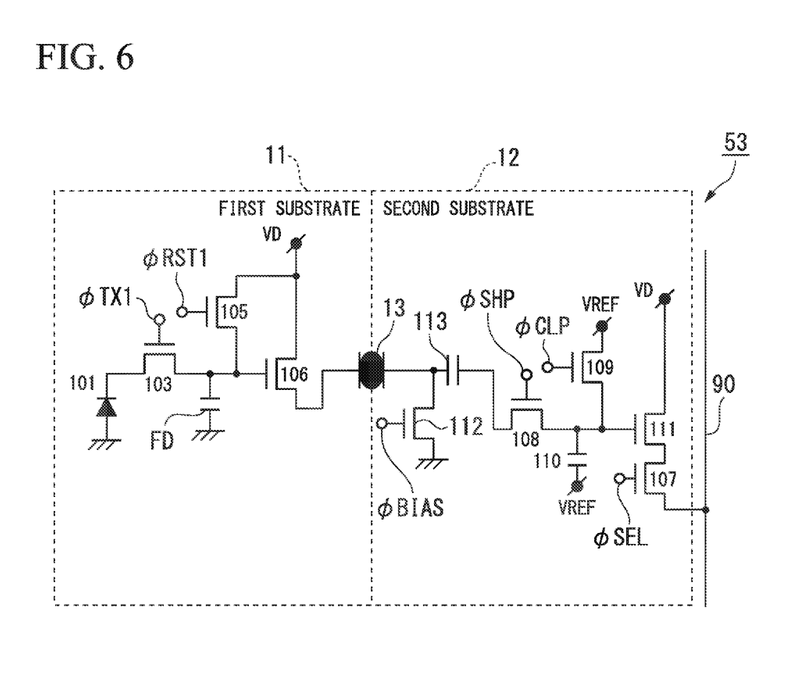
FIG. 6 is a circuit diagram illustrating a structure of a unit pixel within a pixel array section of a solid-state imaging apparatus of a third embodiment of the present invention.

FIG. 6 is a circuit diagram illustrating a schematic configuration of the unit pixel 53 within the pixel array section 40 of the solid-state imaging apparatus 1 of the third embodiment of the present invention. Like the unit pixel 50 illustrated in FIG. 2, the unit pixel 53 converts incident subject light into a pixel signal, and outputs the pixel signal corresponding to the incident subject light to the vertical signal line 90 according to a control signal input from the vertical scanning circuit 20. In FIG. 6, one unit pixel 53 is illustrated. Even in the solid-state imaging apparatus 1 of the third embodiment of the present invention, circuit elements within each unit pixel 53 are divided into the pixel section 11 of the first substrate and the storage circuit 12 of the second substrate and disposed as illustrated in FIG. 6. Hereinafter, a description will be given and the same reference signs will be assigned to circuit elements of functions similar to those of the unit pixel 50 illustrated in FIG. 2 among the circuit elements of the unit pixel 53.

In FIG. 6, the unit pixel 53 includes the photoelectric conversion section 101, the transfer transistor 103, the pixel reset transistor 105, and the first amplification transistor 106 formed in the pixel section 11 of the first substrate, and the selection transistor 107, the intra-pixel sample and hold transistor 108, the intra-pixel clamp transistor 109, the signal holder 110, the second amplification transistor 111, the pixel load transistor 112, and the noise suppression element 113 formed in the storage circuit 12 of the second substrate. In addition, the pixel section 11 of the first substrate and the storage circuit 12 of the second substrate are connected through the inter-substrate connector 13.

The circuit of the unit pixel 50 illustrated in FIG. 2 is different from the circuit of the unit pixel 53 illustrated in FIG. 6 in that, while one terminal (electrode) of the signal holder 110 is connected to GND in the unit pixel 50, one terminal (electrode) of the signal holder 110 is connected to a fixed potential VREF, that is, a potential (hereinafter referred to as "clamp voltage VREF") to be clamped by the intra-pixel clamp transistor 109, in the unit pixel 53.

As described above, in the signal holder 110, a leak current generated between the electrodes may increase when a potential difference between electrodes increases. In the unit pixel 53, it is possible to reduce a potential difference from a potential of a signal input to the other terminal (electrode) of the signal holder 110 via the intra-pixel sample and hold transistor 108 (a noise-canceled signal subjected to the noise cancellation process within the unit pixel 53), that is, a potential difference between the electrodes of the signal holder 110, by connecting one terminal (electrode) of the signal holder 110 to the clamp voltage VREF. Thereby, it is possible to suppress a leak current generated during a waiting period in which a noise-suppressed signal (noise-canceled signal) is held in the signal holder 110.

Drive timings of the unit pixel 53 of the solid-state imaging apparatus 1 of the third embodiment of the present invention and methods of forming the signal holder 110 and the noise suppression element 113 in the unit pixel 53 are substantially the same as in the solid-state imaging apparatuses 1 of the first and second embodiments. Accordingly, detailed description of the drive timings of the unit pixel 53 of the solid-state imaging apparatus 1 of the third embodiment of the present invention and the methods of forming the signal holder 110 and the noise suppression element 113 in the unit pixel 53 is omitted.

As described above, even in the unit pixel 53 provided in the pixel array section 40 within the solid-state imaging apparatus 1 of the third embodiment of the present invention, as in the unit pixel 50 in the first embodiment or the unit pixel 52 in the second embodiment, an area of each of the signal holder 110 and the noise suppression element 113 is increased and a capacitance value is increased without increasing a chip area of the solid-state imaging apparatus 1 by laminating each of the signal holder 110 and the noise suppression element 113. Thereby, even in the unit pixel 53 of the solid-state imaging apparatus 1 of the third embodiment of the present invention, as in the solid-state imaging apparatuses 1 of the first and second embodiments, it is possible to suppress noise generated at the time of an operation of suppressing the noise (an operation of the noise cancellation process) or a leak current generated during a waiting period in which a noise-suppressed signal (noise-canceled signal) is held in the signal holder 110 and suppress the deterioration of signal quality.

In addition, in the unit pixel 53 provided in the pixel array section 40 within the solid-state imaging apparatus 1 of the third embodiment of the present invention, a potential difference between electrodes of the signal holder 110 is reduced. Thereby, in the unit pixel 53 of the solid-state imaging apparatus 1 of the third embodiment of the present invention, it is possible to suppress a leak current, which is generated during a waiting period in which a noise-suppressed signal (noise-canceled signal) is held in the signal holder 110, including a leak generated between electrodes of the signal holder 110, and further suppress the deterioration of signal quality.

Fourth Embodiment

Figure 7:
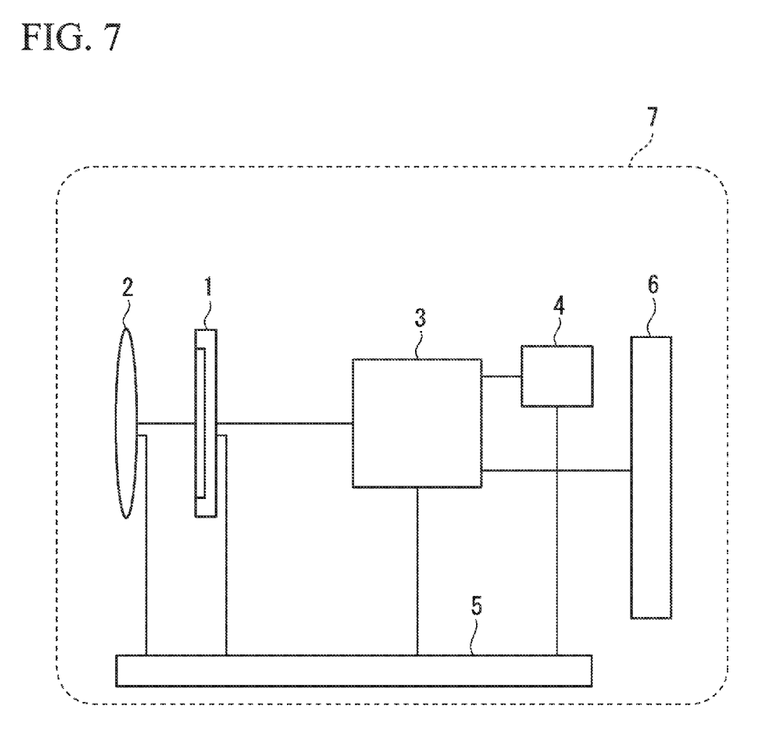
FIG. 7 is a block diagram illustrating a schematic configuration of an imaging apparatus equipped with a solid-state imaging apparatus according to an embodiment of the present invention.

Next, an imaging apparatus equipped with any one of the solid-state imaging apparatuses 1 of the first to third embodiments will be described. FIG. 7 is a block diagram illustrating a schematic configuration of an imaging apparatus (for example, a digital single-lens camera) equipped with a solid-state imaging apparatus 1 according to an embodiment of the present invention. The components shown here can be implemented with elements including a central processing unit (CPU) and a memory of a computer in hardware or implemented with a computer program or the like in software. However, here, functional blocks implemented in cooperation therewith are shown. Accordingly, it can be appreciated by those skilled in the art that the functional blocks may be implemented in various forms by a combination of hardware and software.

An imaging apparatus 7 illustrated in FIG. 7 includes a lens unit section 2, a solid-state imaging apparatus 1, an image signal processing apparatus 3, a recording apparatus 4, a camera control apparatus 5, and a display apparatus 6.

Driving of zoom, focus, a diaphragm, and the like in the lens unit section 2 is controlled by the camera control apparatus 5, and a subject image is formed on the solid-state imaging apparatus 1.

The solid-state imaging apparatus 1 is the solid-state imaging apparatus 1 of the first embodiment, the second embodiment, or the third embodiment. The solid-state imaging apparatus 1 is driven and controlled by the camera control apparatus 5, converts subject light incident within the solid-state imaging apparatus 1 via the lens unit section 2 into an electrical signal, and outputs an image signal corresponding to an amount of incident light to the image signal processing apparatus 3.

For an image signal input from the solid-state imaging apparatus 1, the image signal processing apparatus 3 performs processing such as signal amplification, conversion into image data, various correction, and compression of image data. The image signal processing apparatus 3 uses a memory (not illustrated) as means for temporarily storing image data in each processing.

The recording apparatus 4 is a detachable recording medium such as a semiconductor memory, and records or reads image data.

The display apparatus 6 is a display apparatus such as liquid crystal configured to display an image based on image data processed by the image signal processing apparatus 3 or image data read from the recording apparatus 4 after an image is formed on the solid-state imaging apparatus 1.

The camera control apparatus 5 is a control apparatus which performs the overall control of the imaging apparatus 7.

As described above, the imaging apparatus 7 of the first embodiment of the present invention is equipped with the solid-state imaging apparatus 1 of the first embodiment, the second embodiment, or the third embodiment. Thereby, the image signal processing apparatus 3 provided in the imaging apparatus 7 of the first embodiment of the present invention can generate image data by processing an image signal of which the deterioration of signal quality has been suppressed. Thereby, the imaging apparatus 7 of the first embodiment of the present invention can output high-quality image data.

As described above, according to the embodiment for practicing the present invention, unit pixels within the pixel array section of the solid-state imaging apparatus are divided and formed on the first substrate and the second substrate, so that an increase in a chip area of the solid-state imaging apparatus can be avoided.

In addition, each unit pixel of the solid-state imaging apparatus according to an embodiment for practicing the present invention is formed by laminating each of the signal holder and the noise suppression element on a plurality of different layers within the second substrate. Thereby, in each unit pixel, it is possible to increase the capacitance value by increasing the area of each of the signal holder and the noise suppression element even when each unit pixel is formed in the same planar region as in the solid-state imaging apparatus of the related art without increasing a chip area of the solid-state imaging apparatus 1. Thereby, in each unit pixel, it is possible to suppress noise generated at the time of an operation of suppressing the noise (an operation of the noise cancellation process) or a leak current generated during a waiting period in which a noise-suppressed signal (noise-canceled signal) is held in the signal holder and suppress the deterioration of signal quality.

In addition, in each unit pixel of the solid-state imaging apparatus according to an embodiment for practicing the present invention, one terminal (electrode) of the signal holder is connected to a fixed potential (clamp voltage). Thereby, in each unit pixel, it is possible to reduce a potential difference between electrodes of the signal holder. Thereby, in each unit pixel, it is possible to suppress a leak current, which is generated during a waiting period in which a noise-suppressed signal (noise-canceled signal) is held in the signal holder, including a leak generated between electrodes of the signal holder, and further suppress the deterioration of signal quality.

The specific configuration in the present invention is not limited to the embodiment for practicing the present invention, and various changes and modifications can be made without departing from the scope of the invention. In addition, the circuit configuration and the specific configuration of the driving method in the present invention are not limited to the embodiment for practicing the present invention, and various changes and modifications can be made without departing from the scope of the invention. For example, it is possible to apply a concept of the present invention as a method of forming a capacitance element provided in each unit pixel even when the component or circuit configuration of the solid-state imaging apparatus or the unit pixel is changed or a control method of a unit pixel by a vertical scanning circuit is changed due to a change in the component or driving method of the unit pixel.

In addition, the arrangement of a row direction and a column direction of the unit pixels is not limited to the embodiment for practicing the present invention, and the number of row and column directions in which unit pixels are disposed can be changed without departing from the scope of the invention.

In addition, in the solid-state imaging apparatus according to the embodiment of the present invention, two substrates or three or more substrates may be connected through the connector. In the case of the solid-state imaging apparatus in which the three or more substrates are connected through the connector, two substrates thereof correspond to first and second substrates according to the claims.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device comprising:
a first substrate;
a second substrate electrically connected to the first substrate through a connector; and
circuit elements disposed in the first substrate and in the second substrate, and forming pixels,
wherein each of the pixels comprising:
a photoelectric conversion element disposed in the first substrate and configured to generate a signal corresponding to an amount of incident light; and
a signal holder disposed in the second substrate in correspondence with the photoelectric conversion element and configured to hold an output signal corresponding to the signal generated by the corresponding photoelectric conversion element, and
wherein the signal holder includes:
a first capacitance formed on the second substrate; and
a second capacitance formed on the first capacitance, and
wherein the first capacitance and the second capacitance are at least a partly laminated.

2. The solid-state imaging apparatus according to claim 1, wherein each of the pixels further comprises:
a noise suppression section disposed on the second substrate in correspondence with the photoelectric conversion element and used for cancellation of a noise component included in the signal generated by the corresponding photoelectric conversion element, and
wherein the noise suppression section comprises:
a noise suppression element formed by laminating a capacitance element including a plurality of electrodes on a plurality of layers within the second substrate.

3. A solid-state imaging device comprising:
a first substrate;
a second substrate electrically connected to the first substrate through a connector; and
circuit elements disposed in the first substrate and in the second substrate, and forming pixels,
wherein each of the pixels comprising:
a photoelectric conversion element disposed in the first substrate and configured to generate a signal corresponding to an amount of incident light;
a noise suppression section including a noise suppression element disposed in the second substrate in correspondence with the photoelectric conversion element and used for cancellation of a noise component included in the signal generated by the photoelectric conversion element; and a signal holder disposed in the second substrate in correspondence with the photoelectric conversion element and configured to hold a noise-canceled signal from which a noise component has been canceled by the noise suppression section, wherein the noise suppression element includes a first capacitance formed on the second substrate, wherein the signal holder includes a second capacitance formed on the first capacitance, and wherein the first capacitance and the second capacitance are at least a partly laminated.

4. The solid-state imaging apparatus according to claim 3, wherein each of the noise suppression element and the signal holder is divided and formed on a different layer within the second substrate in units of the noise suppression element and the signal holder.

5. The solid-state imaging apparatus according to claim 2, wherein the signal holder has an electrode of one terminal connected to a clamp voltage for clamping the noise suppression element to a predetermined fixed potential when the noise suppression section cancels a noise component included in a signal generated by the corresponding photoelectric conversion element.

6. The solid-state imaging apparatus according to claim 1, wherein the capacitance element is a capacitance element of a metal-insulator-metal (MIM) structure in which an insulator is interposed between electrodes.

7. The solid-state imaging apparatus according to claim 1, wherein, in the capacitance element, each of the plurality of electrodes forming the capacitance element is formed of a different material for each corresponding layer within the second substrate.

8. An imaging apparatus comprising:
a solid-state imaging device,
wherein the solid-state imaging device comprising:
a first substrate;
a second substrate electrically connected to the first substrate through a connector; and
circuit elements disposed in the first substrate and in the second substrate, and forming pixels,
wherein each of the pixels comprising:

a photoelectric conversion element disposed in the first substrate and configured to generate a signal corresponding to an amount of incident light; and a signal holder disposed in the second substrate in correspondence with the photoelectric conversion element and configured to hold an output signal corresponding to the signal generated by the corresponding photoelectric conversion element, and wherein the signal holder includes:
a first capacitance formed on the second substrate; and
a second capacitance formed on the first capacitance, and wherein the first capacitance and the second capacitance are at least a partly laminated.

9. An imaging apparatus comprising:
a solid-state imaging device,
wherein the solid-state imaging device comprising:
a first substrate;
a second substrate electrically connected to the first substrate through a connector; and
circuit elements disposed in the first substrate and in the second substrate, and forming pixels,
wherein each of the pixels comprising:
a photoelectric conversion element disposed in the first substrate and configured to generate a signal corresponding to an amount of incident light;
a noise suppression section including a noise suppression element disposed in the second substrate in correspondence with the photoelectric conversion element and used for cancellation of a noise component included in the signal generated by the corresponding photoelectric conversion element; and
a signal holder disposed on the second substrate in correspondence with the photoelectric conversion element and configured to hold a noise-canceled signal from which a noise component has been canceled by the noise suppression section,
wherein the noise suppression element includes a first capacitance formed on the second substrate,
wherein the signal holder includes a second capacitance formed on the first capacitance, and
wherein the first capacitance and the second capacitance are at least a partly laminated.

* * * * *